US008163466B2

United States Patent
Chen et al.

(10) Patent No.: US 8,163,466 B2
(45) Date of Patent: Apr. 24, 2012

(54) METHOD FOR SELECTIVELY ADJUSTING LOCAL RESIST PATTERN DIMENSION WITH CHEMICAL TREATMENT

(75) Inventors: Kuang-Jung Chen, Poughkeepsie, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 540 days.

(21) Appl. No.: 12/371,956

(22) Filed: Feb. 17, 2009

(65) Prior Publication Data

US 2010/0209853 A1 Aug. 19, 2010

(51) Int. Cl.
*G03F 7/00* (2006.01)
*G03F 7/004* (2006.01)
*G03F 7/20* (2006.01)
*G03F 7/26* (2006.01)
*G03F 7/40* (2006.01)

(52) U.S. Cl. ............. 430/312; 430/270.1; 430/330; 430/331; 430/313; 430/314; 430/317; 430/394; 430/396

(58) Field of Classification Search ............. 430/270.1, 430/312, 330, 331, 313, 314, 317, 394, 396
See application file for complete search history.

(56) References Cited

U.S. PATENT DOCUMENTS

| | | | | |
|---|---|---|---|---|
| 4,657,629 A * | 4/1987 | Bigelow | | 438/725 |
| 5,686,223 A * | 11/1997 | Cleeves | | 430/312 |
| 6,180,320 B1 * | 1/2001 | Saito et al. | | 430/311 |
| 6,492,075 B1 * | 12/2002 | Templeton et al. | | 430/5 |
| 6,916,594 B2 * | 7/2005 | Bok et al. | | 430/270.1 |
| 7,390,616 B2 | 6/2008 | Brodsky | | |
| 7,534,550 B2 * | 5/2009 | Shimizu et al. | | 430/270.1 |
| 7,666,577 B2 * | 2/2010 | Hagiwara | | 430/312 |
| 7,741,015 B2 * | 6/2010 | Hatakeyama et al. | | 430/312 |
| 7,820,358 B2 * | 10/2010 | Woerz et al. | | 430/270.1 |
| 7,838,200 B2 * | 11/2010 | Chen et al. | | 430/270.1 |
| 7,862,982 B2 * | 1/2011 | Burns et al. | | 430/270.1 |
| 7,887,996 B2 * | 2/2011 | Liu et al. | | 430/312 |
| 7,906,270 B2 * | 3/2011 | Paxton et al. | | 430/311 |
| 7,914,975 B2 * | 3/2011 | Burns et al. | | 430/313 |
| 7,951,722 B2 * | 5/2011 | Ho | | 438/719 |
| 2004/0234897 A1 * | 11/2004 | Ho et al. | | 430/312 |
| 2005/0123858 A1 * | 6/2005 | Ito et al. | | 430/312 |
| 2005/0255411 A1 * | 11/2005 | Frost et al. | | 430/312 |
| 2006/0115747 A1 * | 6/2006 | Lee et al. | | 430/5 |
| 2006/0160028 A1 * | 7/2006 | Lee et al. | | 430/312 |
| 2009/0104564 A1 * | 4/2009 | Yang | | 430/312 |
| 2009/0203224 A1 * | 8/2009 | Shih et al. | | 438/780 |
| 2011/0003253 A1 * | 1/2011 | Miyamoto | | 430/312 |

* cited by examiner

*Primary Examiner* — Amanda C. Walke
(74) *Attorney, Agent, or Firm* — Gibb I.P. Law Firm, LLC; Wenjie Li, Esq.

(57) ABSTRACT

A method forms a first patterned mask (comprising rectangular features and/or rounded openings) on a planar surface and forms a second patterned mask on the first patterned mask and the planar surface. The second patterned mask covers protected portions of the first patterned mask and the second patterned mask reveals exposed portions of the first patterned mask. The method treats the exposed portions of the first patterned mask with a chemical treatment that reduces the size of the exposed portions to create an altered first patterned mask.

20 Claims, 7 Drawing Sheets

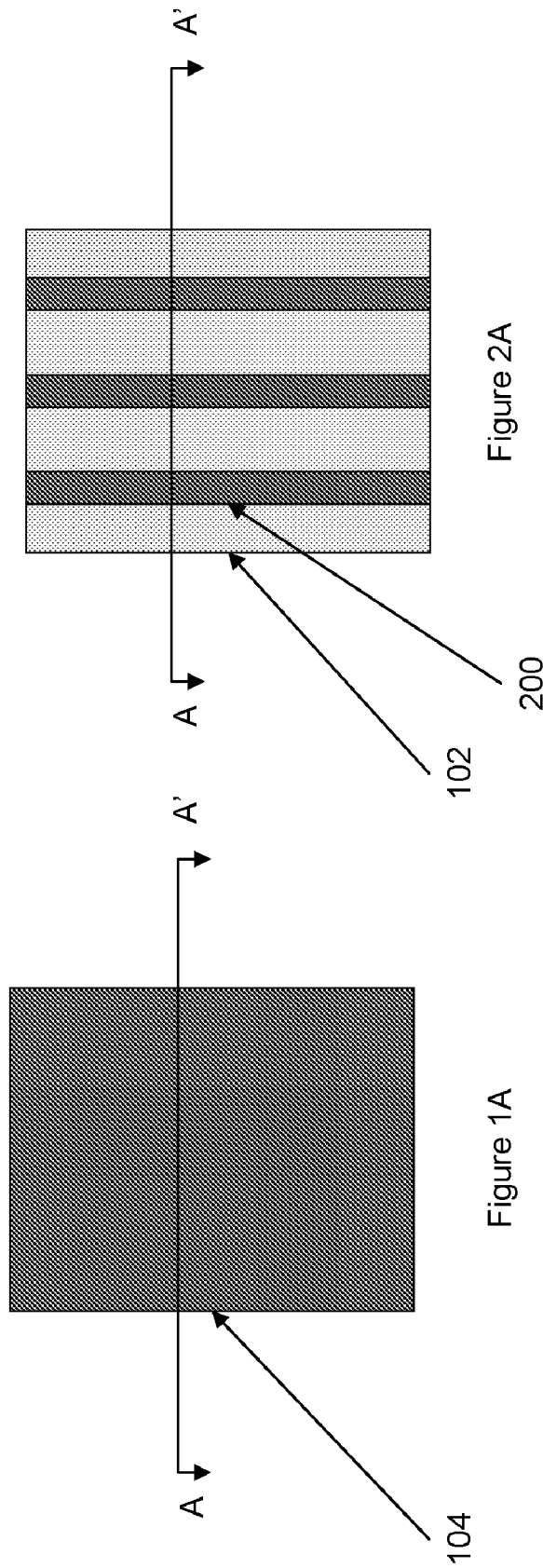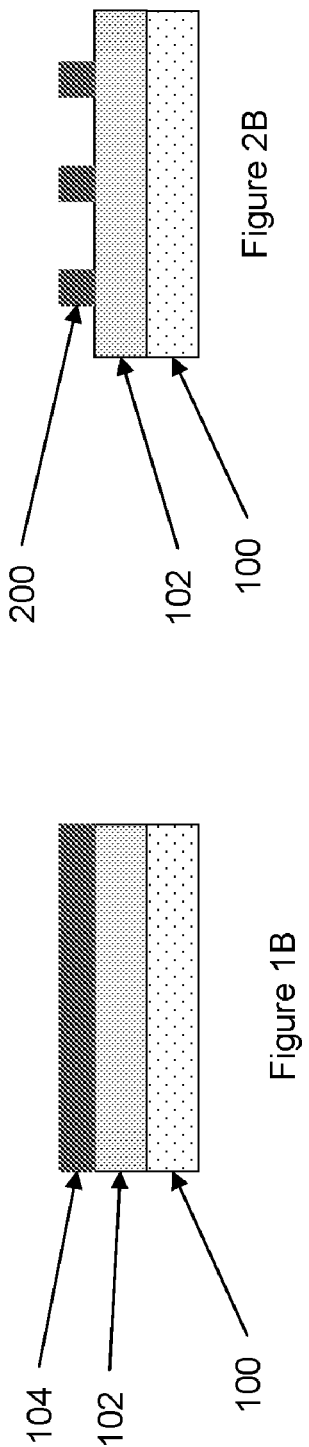

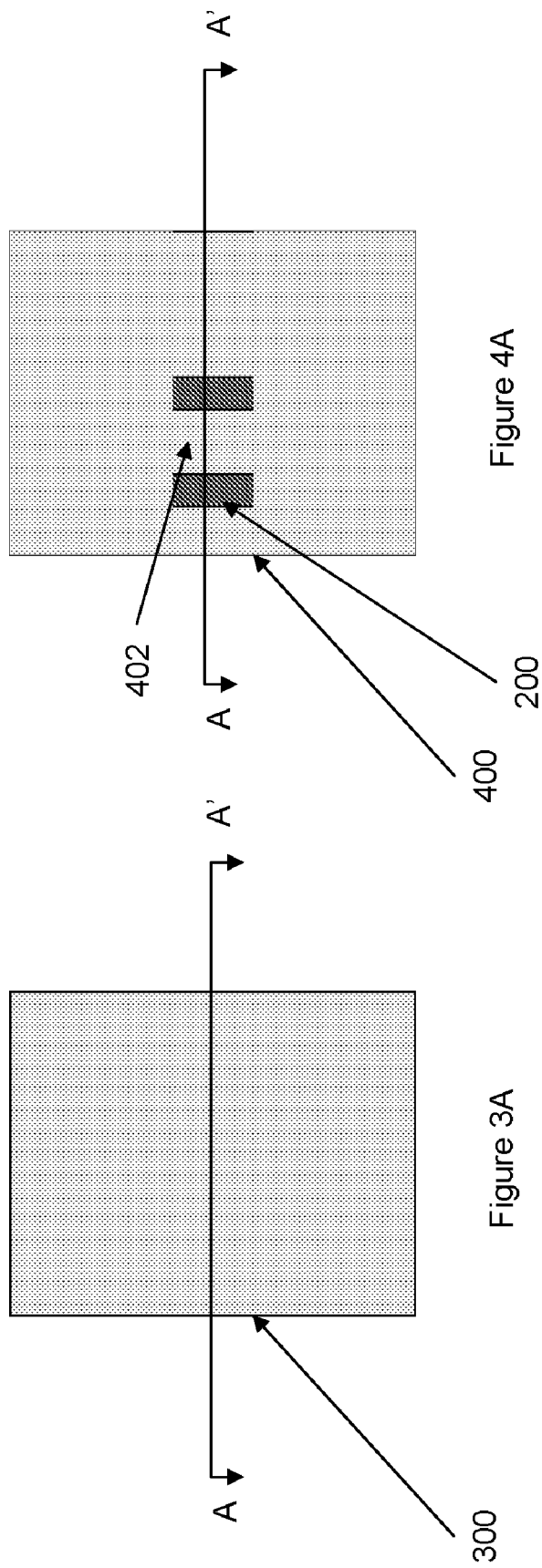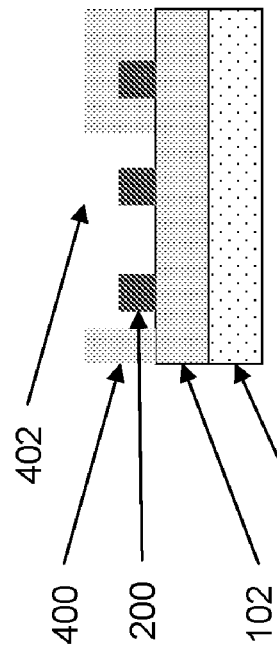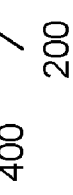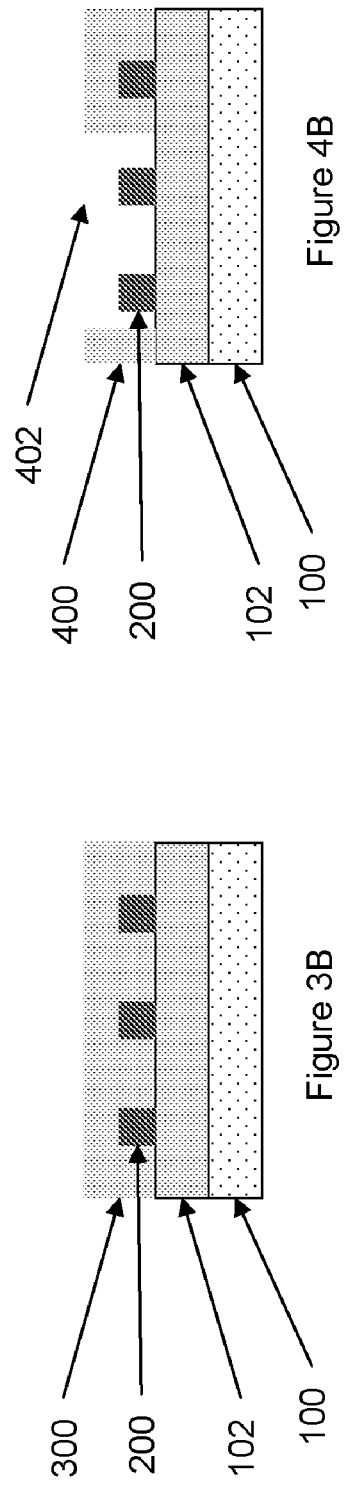

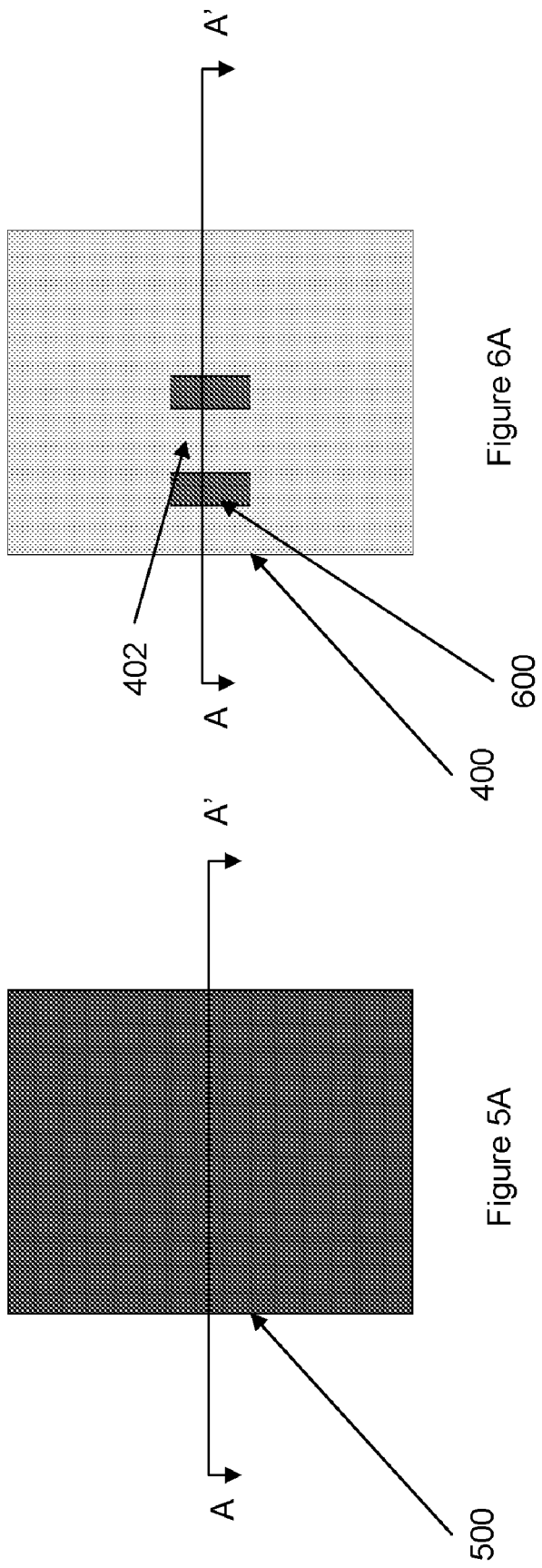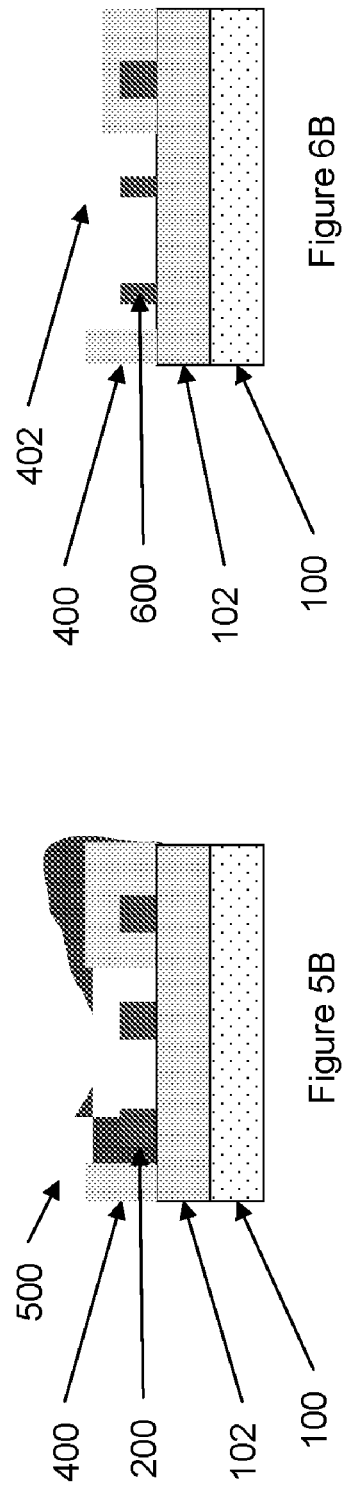

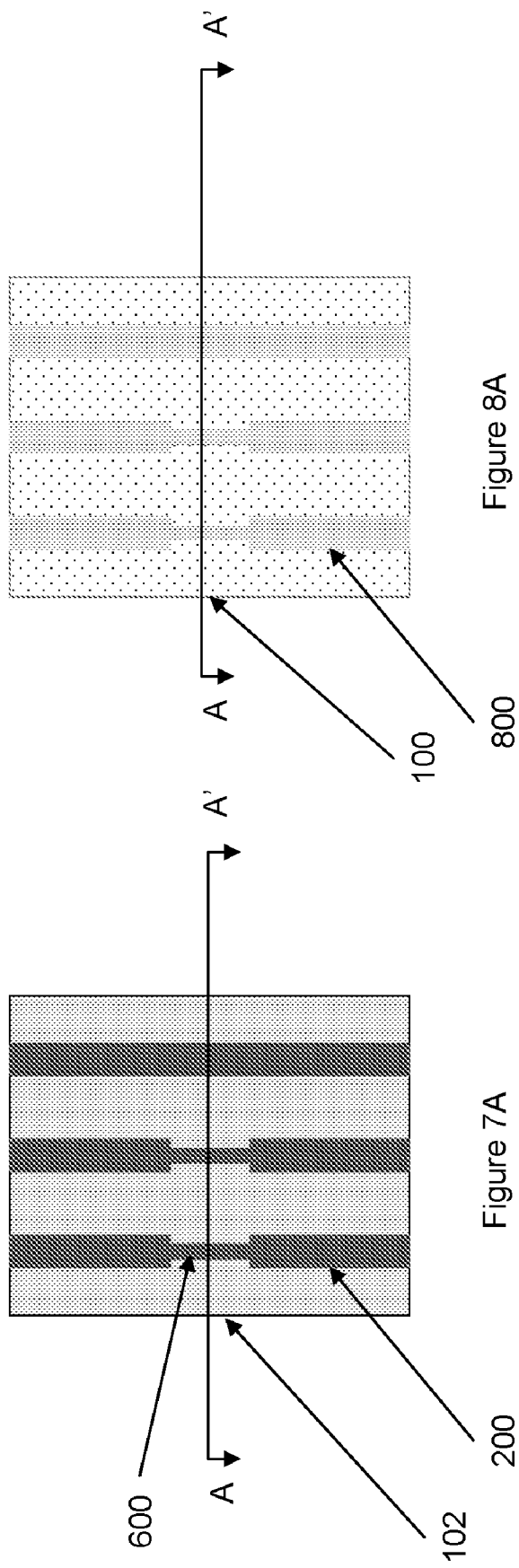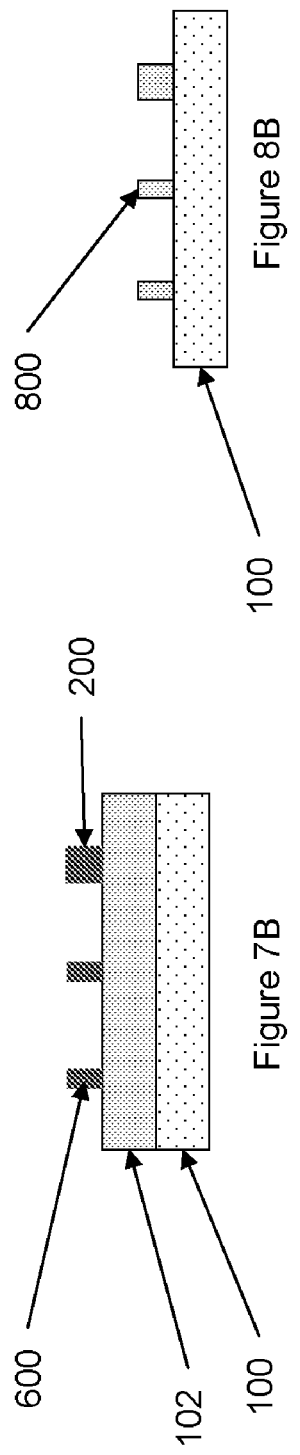

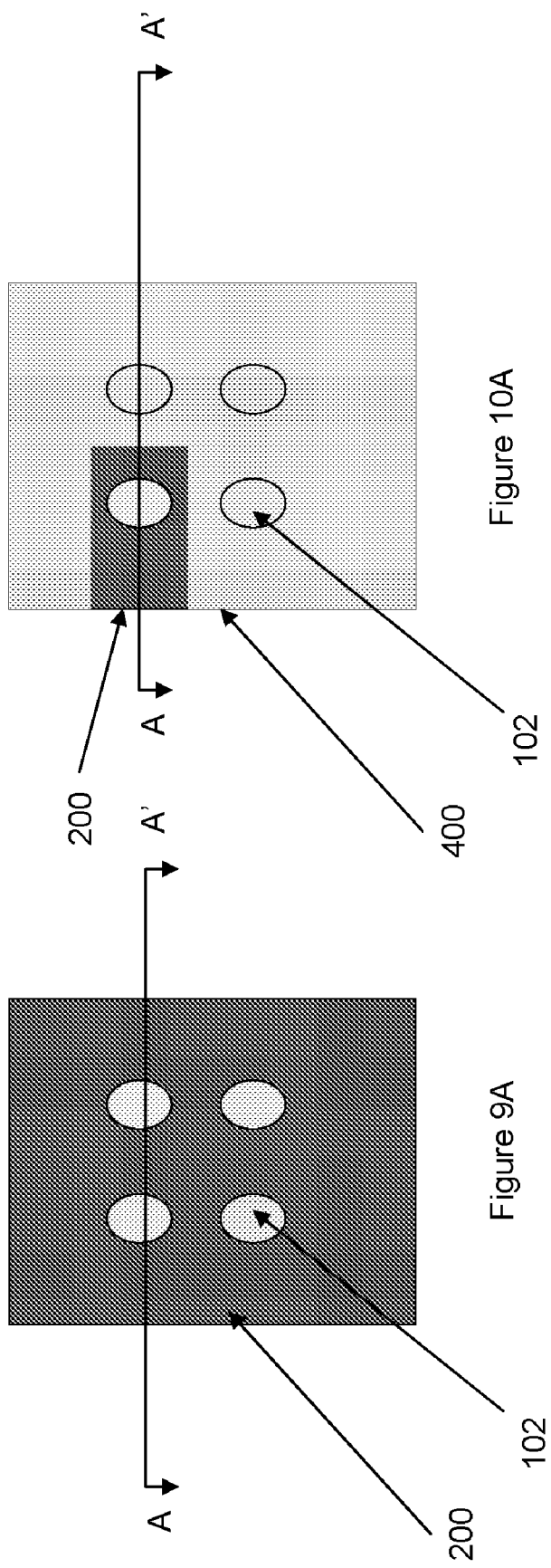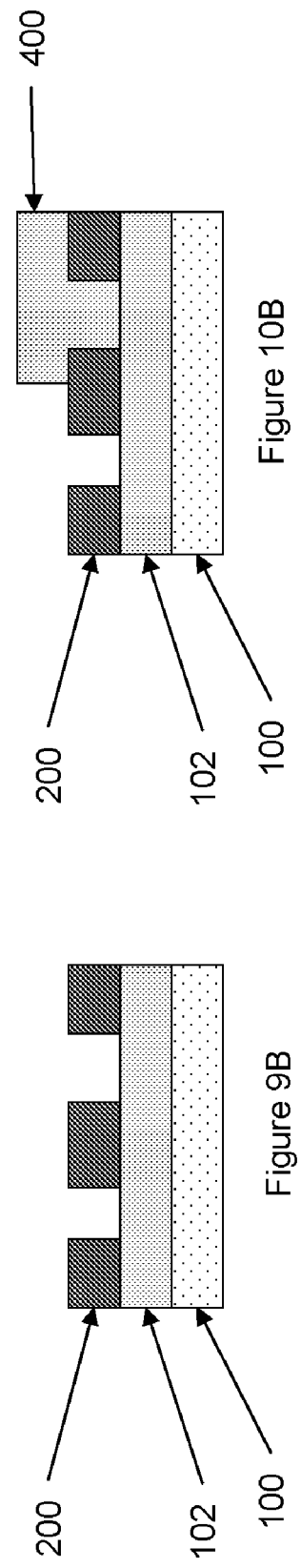

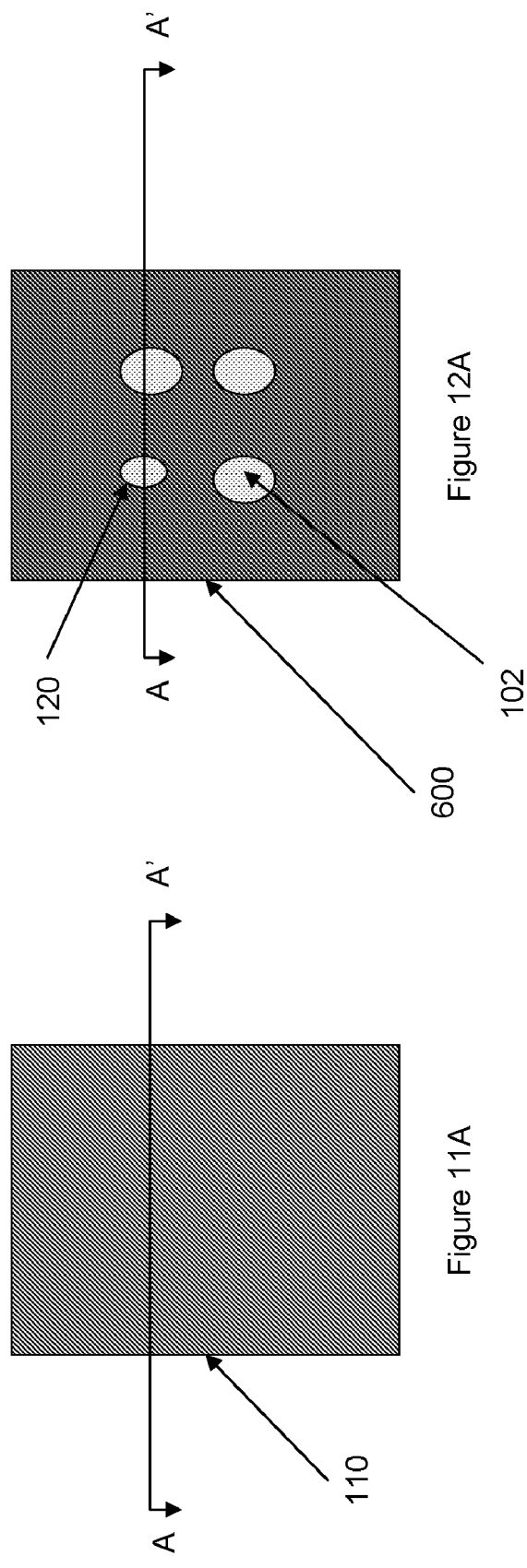
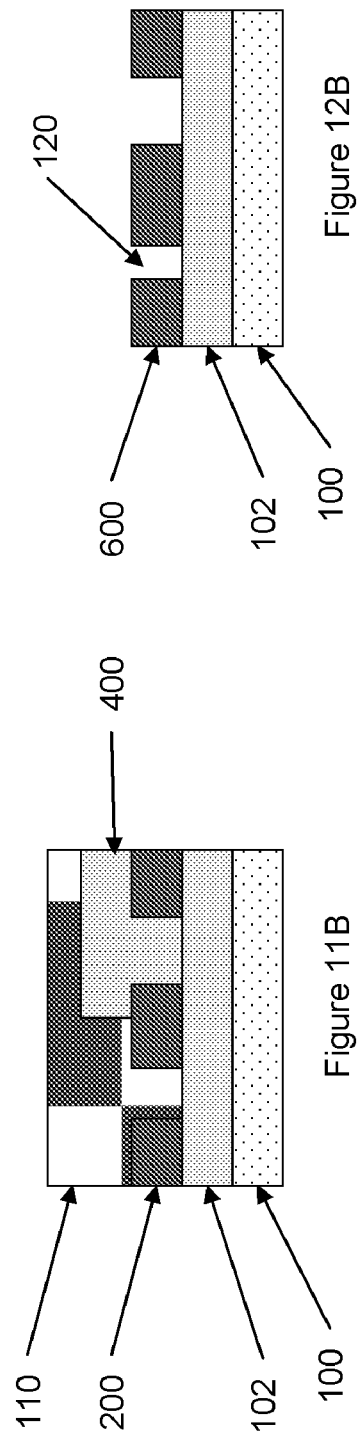
Figure 12A
Figure 12B
Figure 11A
Figure 11B

METHOD FOR SELECTIVELY ADJUSTING LOCAL RESIST PATTERN DIMENSION WITH CHEMICAL TREATMENT

BACKGROUND

1. Field of the Invention

The embodiments of the invention generally relate to the formation of masks used during patterning operations and more particularly to a method of selectively reducing the size of portions of a mask using chemical treatments.

2. Description of the Related Art

Conventional systems utilize chemical treatments to reduce the size of masks; however, such conventional chemical treatments are applied to the entire mask, which limits the usefulness of such treatments. For example, as described in U.S. Pat. No. 7,390,616 (the complete disclosure of which is incorporated herein by reference) the fabrication of integrated circuits on a semiconductor substrate typically includes multiple photolithography steps. A photolithography process begins by applying a thin layer of a photoresist material to the substrate surface. The photoresist is then exposed through a photolithography exposure tool to a radiation source that changes the solubility of the photoresist at areas exposed to the radiation. The photolithography exposure tool typically includes transparent regions that do not interact with the exposing radiation and a patterned material or materials that do interact with the exposing radiation, either to block it or to shift its phase.

As each successive generation of integrated circuits crowds more circuit elements onto the semiconductor substrate, it becomes necessary to reduce the size of the features, i.e., the lines and spaces that make up the circuit elements. The minimum feature size that can be accurately produced on a substrate is limited by the ability of the fabrication process to form an undistorted optical image of the mask pattern onto the substrate, by the chemical and physical interaction of the photoresist with the developer, and by the uniformity of the subsequent process (e.g., etching or diffusion) that uses the patterned photoresist.

Advanced lithography for formation of structures such as contact holes has become increasingly reliant on "shrink" methods in which a contact hole is imaged at a critical dimension (CD) larger than the target dimension, and is thereafter reduced to the target dimension through some post-lithography process. Many different processes use a wide range of techniques including reflow, etch tapering in intermediate layers, and overcoats that bind to the existing pattern with finite thickness. Overcoat technologies offer a good opportunity for controlled distortion of the lithographic image during the shrink (as compared to purely thermal reflow processes, for example) and have good potential to offer consistent CD shrinks within the contact, regardless of pattern density.

Overcoat based chemical shrinks typically rely on an interaction with the already imaged resist material, wherein a new film is spin cast such that both materials fill in and overcoat the previously imaged material with a finite thickness. For example, in some common schemes, residual acid in the resist is used to catalyze a reaction with the overcoat material that crosslinks a controlled thickness of the overcoat both within the contact hole and on top of the resist surface.

SUMMARY

One embodiment of the invention is a method that forms a first patterned mask (comprising rectangular features and/or rounded openings) on a planar surface, such as an insulator layer, conductor layer, a silicon substrate, etc., and forms a second patterned mask on the first patterned mask and the planar surface. The second patterned mask covers protected portions of the first patterned mask and the second patterned mask reveals exposed portions of the first patterned mask. The forming of the first patterned mask comprises patterning a first photoresist, and the forming of the second patterned mask comprises patterning a second photoresist different than the first photoresist.

The method treats the exposed portions of the first patterned mask with a chemical treatment that reduces the size of the exposed portions to create an altered first patterned mask. The treating of the exposed portions reduces the height dimensions and the width dimensions of the exposed portions of the first patterned mask. The process of treating the exposed portions of the first patterned mask comprises steps of applying a chemical treatment to the exposed portions of the first patterned mask, heating the chemical treatment, and developing the chemical treatment.

Then, the method removes the second patterned mask to permit patterning of the planar surface using the altered first patterned mask. The altered first patterned mask can be removed after the planar surface is patterned.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 1A and 1B are schematic top and cross-sectional view diagrams of a stage of manufacturing a patterned integrated circuit structure;

FIGS. 2A and 2B are schematic top and cross-sectional view diagrams of a stage of manufacturing a patterned integrated circuit structure;

FIGS. 3A and 3B are schematic top and cross-sectional view diagrams of a stage of manufacturing a patterned integrated circuit structure;

FIGS. 4A and 4B are schematic top and cross-sectional view diagrams of a stage of manufacturing a patterned integrated circuit structure;

FIGS. 5A and 5B are schematic top and cross-sectional view diagrams of a stage of manufacturing a patterned integrated circuit structure;

FIGS. 6A and 6B are schematic top and cross-sectional view diagrams of a stage of manufacturing a patterned integrated circuit structure;

FIGS. 7A and 7B are schematic top and cross-sectional view diagrams of a stage of manufacturing a patterned integrated circuit structure;

FIGS. 8A and 8B are schematic top and cross-sectional view diagrams of a stage of manufacturing a patterned integrated circuit structure;

FIGS. 9A and 9B are schematic top and cross-sectional view diagrams of a stage of manufacturing a patterned integrated circuit structure;

FIGS. 10A and 10B are schematic top and cross-sectional view diagrams of a stage of manufacturing a patterned integrated circuit structure;

FIGS. 11A and 11B are schematic top and cross-sectional view diagrams of a stage of manufacturing a patterned integrated circuit structure;

FIGS. 12A and 12B are schematic top and cross-sectional view diagrams of a stage of manufacturing a patterned integrated circuit structure.

DETAILED DESCRIPTION OF EMBODIMENTS

Figure 13:
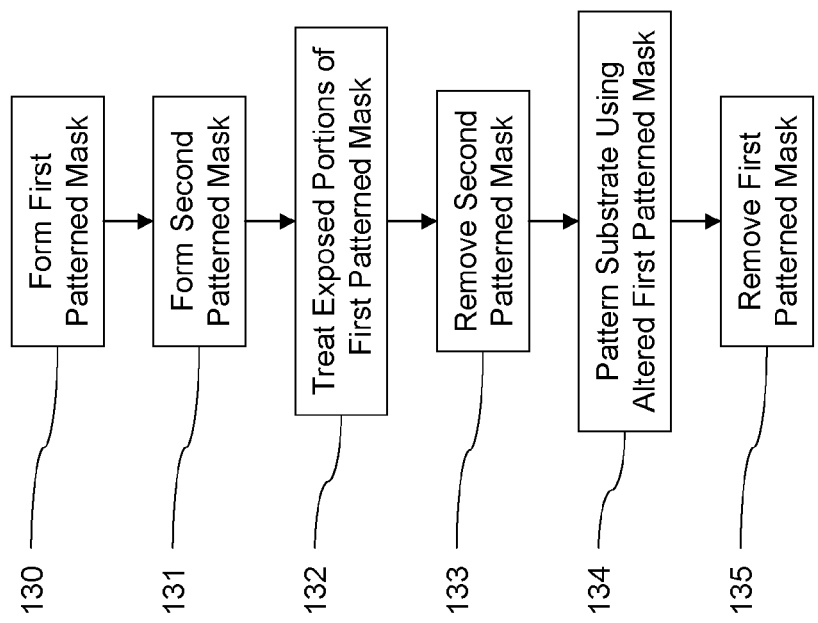
FIG. 13 is a flow diagram illustrating a method embodiment of the invention.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, overcoat technologies offer a good opportunity for control of the lithographic image during the shrinking process and have good potential to offer consistent critical dimension shrinks, regardless of pattern density. However, such conventional chemical treatment (trimming) processes uniformity apply the acidic aqueous solution to the entire mask structure. Since the conventional methodologies affect all resist patterns across the entire wafer, they limit the application of such chemical shrinking processes to specific designs. To the contrary, the embodiments presented below selectively allow one to choose the photoresist pattern portions that are subjected to the shrinking process. These embodiments only use a single etching step up and do not affect overlap.

More specifically, the embodiments discussed herein conceptually freeze the resist image using a second resist and only expose selected portions of the first resist pattern using openings within the second resist pattern. Then, after a portion of the first resist pattern has been protected, the methods herein can apply a layer of chemical treatment, bake and develop, followed by standard resist stripping and etching, as shown for example in FIGS. 1A-8B. A second embodiment, shown in FIGS. 9A-12B, similarly applies the chemical treatment to limited areas of the first resist; however, while the first embodiment relates to rectangular structures, the second embodiment relates to curved structures, such as round or oval openings.

More specifically, as shown in FIGS. 1A-2B, in one embodiment, a first patterned mask 200 (comprising rectangular features) is formed on a planar surface 102, such as an insulator layer, conductor layer, a silicon substrate, etc. Item 100 illustrates an underlying layer, which can comprise any layer within a multi-layer structure, such as a substrate. More specifically, the first patterned mask 200 is formed by patterning a first photoresist 104 into rectangular patterns using conventional photoresist technologies, including patterned exposure and development.

As shown in FIG. 3A-4B this method forms a second patterned mask on the first patterned mask 200 and the planar surface 102. This process patterns a second photoresist 300 that is different than the first photoresist 104. The second patterned mask 400 covers protected portions of the first patterned mask 200, such as those patterns that are not visible in FIG. 3A. Additionally, the second patterned mask 400 reveals exposed portions of the first patterned mask 200, such as those that are visible through the opening 402 shown in FIGS. 4A-4B.

As shown in FIGS. 5A-5B, the method treats the exposed portions of the first patterned mask 200 with a chemical treatment 500. The precise chemical compounds used within the chemical treatment 500 will vary depending upon the material utilized for the first pattern mask 200. Irrespective of which specific chemicals are utilized in the chemical treatment 500, the resulting effect would be to remove some of the first pattern mask 200 so that the height and width of the features of the exposed portions of the first pattern mask 200 are reduced in size, as shown in FIGS. 6A-6B. Thus, for example, the chemical treatment 500 can comprise an acidic solution. In addition, again depending upon the specific makeup of the chemical treatment 500, the structure could be heated and/or developed in any manner necessary. In the drawings, the altered first pattern mask is labeled as item 600.

Then, as shown in FIGS. 7A-7B, the method removes the second patterned mask 400 to permit patterning of the planar surface 102 using the altered first patterned mask 600. The planar surface 102 can be patterned into a patterned surface 800 using any conventional material removal technique, such as any form of etching, chemical dissolving etc., whereby only those portions of the planar surface 102 that were positioned below the altered first pattern mask 600 remain. The altered first patterned mask 600 can be removed after the planar surface 102 is patterned into the patterned surface 800, as shown in FIGS. 8A-8B.

The embodiments shown in FIGS. 1A-8B involve processes whereby portions of a mask are reduced in size. To the contrary, the embodiments shown in FIGS. 9A-12B illustrate embodiments whereby selective openings within a mask are reduced in size (without affecting the size of other openings of the same mask).

More specifically, FIGS. 9A-9B illustrates the same substrate 100, planar layer 102, and first patterned mask 200; however, the patterns within the first patterned mask 200 shown in FIGS. 9A-12B include rounded openings. FIGS. 10A-10B illustrate the same process that was described above whereby a second pattern mask 400 is formed over the first pattern mask 200 and over the planar layer 102.

In FIGS. 11A-11B, again a chemical treatment 110 is applied (deposited) over the structure. This chemical treatment 110 is similar to the chemical treatment 500 discussed above, except that the makeup of this chemical treatment 110 is designed to decrease the size of the openings that are exposed by the second patterned mask 400. Again, the chemical treatment 110 can comprise any form of chemical treatment that will tend to expand the material of the first pattern the mask 200, so as to reduce the size of the rounded openings that are exposed by the second patterned mask 400. As mentioned in U.S. Pat. No. 7,390,616 (discussed above) such an overcoat based chemical 110 shrinks the areas of the first pattern mask 200 that come in contact with the chemical treatment 110 based upon a chemical interaction between the chemical treatment 110 and the first pattern mask 200. For example, the chemical treatment 110 could be spin cast such that both materials fill in and overcoat the previously imaged material with a finite thickness. For example, residual acid in the resist 200 is used to catalyze a reaction with the overcoat material 110 that crosslinks a controlled thickness of the overcoat 110, thereby increasing the size of the first pattern to mask (and correspondingly decreasing the size of one the openings 120, shown in FIGS. 12A-12B).

Thus, the chemical treatments 110, 500 are different in that one is designed to reduce the size of the second pattern mask 200 material (through material removal or material shrinkage) while the other chemical treatment is designed to increase the size of the second pattern mask 200 material so as to shrink the size of rounded pattern openings. As shown above in FIGS. 7A-8B, the altered second patterned mask 600 can then be used to pattern the underlying plainer layer 102.

FIG. 13 is a flow diagram according to an embodiment of the invention that begins in item 130 by forming a first patterned mask (comprising rectangular features and/or rounded openings) on a planar surface, such as an insulator layer, conductor layer, a silicon substrate, etc. In item 131, the method forms a second patterned mask on the first patterned mask and the planar surface. As shown above, the second patterned mask covers protected portions of the first patterned mask and the second patterned mask reveals exposed portions of the first patterned mask. The forming of the first patterned mask 130 comprises patterning a first photoresist, and the forming of the second patterned mask 131 comprises patterning a second photoresist different than the first photoresist.

The method then treats the exposed portions of the first patterned mask with a chemical treatment that reduces the size of the exposed portions to create an altered first patterned mask in item 132. The treating of the exposed portions 132 reduces the height dimensions and the width dimensions of the exposed portions of the first patterned mask or increases the size of the mask so as to reduce the size of the openings within the mask. Further, in item 132, the size of the mask material could be reduced to the point where the exposed portions of mask material are completely removed (portions of the second pattern mask are eliminated). Alternatively, in item 132, the size of the mask could be increased to the extent that openings are completely filled in by the second patterned mask material (the openings are eliminated). The process of treating the exposed portions of the first patterned mask 132 comprises steps of applying a chemical (e.g., acidic) solution to the exposed portions of the first patterned mask, heating the structure and acidic solution, and developing the acidic solution.

Then, the method removes the second patterned mask in item 133 to permit patterning of the planar surface using the altered first patterned mask in item 134. The altered first patterned mask can then be removed after the planar surface is patterned, as shown by item 135.

Thus, as shown above, conventional methodologies for shrinking mask features affect all resist patterns across the entire wafer, which limits the application of such chemical shrinking processes to specific designs. To the contrary, the embodiments herein allow one to selectively choose the photoresist pattern portions that are subjected to the shrinking process. These embodiments only use a single etching step up and do not affect overlap. The embodiments discussed herein conceptually freeze the resist image using a second resist and only expose selected portions of the first resist pattern using openings within the second resist pattern. Then, after a portion of the first resist pattern has been protected, the methods herein can apply a layer of chemical solution, bake and develop, followed by standard resist stripping and etching to selectively reduce the size of the underlying features being patterned.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method comprising:
   forming a first patterned mask on a planar surface;
   forming a second patterned mask on said first patterned mask and said planar surface, said second patterned mask covering protected portions of said first patterned mask and said second patterned mask revealing exposed portions of said first patterned mask;
   while said second patterned mask covers said first patterned mask, treating only said exposed portions of said first patterned mask with a chemical treatment that changes a size of only said exposed portions to create an altered first patterned mask; and
   after said treating of said exposed portions, removing said second patterned mask.

2. The method according to claim 1, said treating of said exposed portions of said first patterned mask comprising:
   applying a chemical treatment;
   heating said chemical treatment and said first patterned mask; and
   developing said chemical treatment.

3. The method according to claim 1, further comprising patterning said planar surface using said altered first patterned mask.

4. The method according to claim 3, further comprising removing said altered first patterned mask after patterning said planar surface.

5. The method according to claim 1, said forming of said first patterned mask comprising patterning a first photoresist, and said forming of said second patterned mask comprising patterning a second photoresist.

6. The method according to claim 1, said treating of said exposed portions reducing a height dimension and a width dimension of said exposed portions of said first patterned mask.

7. The method according to claim 1, said planar surface comprising an upper layer of a one of an insulator layer, a conductor layer, and a silicon substrate.

8. A method comprising:
   forming a first patterned mask comprising rectangular features on a planar surface;
   forming a second patterned mask on said first patterned mask and said planar surface, said second patterned mask covering protected portions of said first patterned mask and said second patterned mask revealing exposed portions of said first patterned mask;
   while said second patterned mask covers said first patterned mask, treating only said exposed portions of said first patterned mask with a chemical treatment that reduces a size of said rectangular features of only said exposed portions to create an altered first patterned mask; and
   after said treating of said exposed portions, removing said second patterned mask.

9. The method according to claim 8, said treating of said exposed portions of said first patterned mask comprising:
applying a chemical treatment;
heating said chemical treatment and said first patterned mask; and
developing said chemical treatment.

10. The method according to claim 8, further comprising patterning said planar surface using said altered first patterned mask.

11. The method according to claim 10, further comprising removing said altered first patterned mask after patterning said planar surface.

12. The method according to claim 8, said forming of said first patterned mask comprising patterning a first photoresist, and said forming of said second patterned mask comprising patterning a second photoresist.

13. The method according to claim 8, said treating of said exposed portions reducing a height dimension and a width dimension of said exposed portions of said first patterned mask.

14. The method according to claim 8, said planar surface comprising an upper layer of a one of an insulator layer, a conductor layer, and a silicon substrate.

15. A method comprising:
forming a first patterned mask comprising rounded openings on a planar surface;
forming a second patterned mask on said first patterned mask and said planar surface, said second patterned mask covering protected portions of said first patterned mask and said second patterned mask revealing exposed portions of said first patterned mask;
while said second patterned mask covers said first patterned mask, treating only said exposed portions of said first patterned mask with a chemical treatment that reduces a size of said rounded openings of only said exposed portions to create an altered first patterned mask; and
after said treating of said exposed portions, removing said second patterned mask.

16. The method according to claim 15, said treating of said exposed portions of said first patterned mask comprising:
applying a chemical treatment;
heating said chemical treatment and said first patterned mask; and
developing said chemical treatment.

17. The method according to claim 15, further comprising patterning said planar surface using said altered first patterned mask.

18. The method according to claim 17, further comprising removing said altered first patterned mask after patterning said planar surface.

19. The method according to claim 15, said forming of said first patterned mask comprising patterning a first photoresist, and said forming of said second patterned mask comprising patterning a second photoresist.

20. The method according to claim 15, said treating of said exposed portions reducing a width dimension of said rounded openings of said first patterned mask.

* * * * *